United States Patent [19]
Rees

[11] Patent Number: 5,821,770
[45] Date of Patent: Oct. 13, 1998

[54] OPTION DECODING WITH ON-CHIP ELECTRICAL FUSES

[75] Inventor: David Rees, Basingstoke, United Kingdom

[73] Assignee: Cypress Semiconductor Corporation, San Jose, Calif.

[21] Appl. No.: 640,032

[22] Filed: Apr. 30, 1996

[51] Int. Cl.⁶ .......................... H03K 19/173; H01H 85/02
[52] U.S. Cl. ................................ 326/38; 326/45; 326/50; 327/525
[58] Field of Search ................................. 326/38, 49–50, 326/44–45; 327/525

[56] References Cited

U.S. PATENT DOCUMENTS

| | | | |
|---|---|---|---|
| 4,689,494 | 8/1987 | Chen et al. | 326/38 |
| 4,887,239 | 12/1989 | Turner | 326/38 |
| 5,309,394 | 5/1994 | Wuertz et al. | 326/38 |
| 5,508,638 | 4/1996 | Cowles et al. | 326/38 |
| 5,629,635 | 5/1997 | Reno | 326/38 |

OTHER PUBLICATIONS

Mano, *Computer Engineering: Hardware Design*. Prentice Hall, NJ. 1988. pp. 205–207.

*Primary Examiner*—Edward P. Westin
*Assistant Examiner*—Jon Santamauro
*Attorney, Agent, or Firm*—Maiorana & Acosta, PC

[57] ABSTRACT

A method for varying the type of function selected on a chip (for example, after completion of manufacturing) may include the steps of providing predetermined fuse arrangements which individually or in combination correspond to each type of function on the chip and providing disable control lines having fuses to each of the predetermined fuse arrangements. When one of the types of circuits is selected, the predetermined fuse arrangement individually or in combination corresponding to that selected type of function is blown. The blowing of fuses may change the functionality of the chip directly or may perform a complex procedure such as controlling a portion of a decoding scheme which may radically change the function of the chip. To prevent further blowing of predetermined fuse arrangements, the fuses in disable control lines to each of the predetermined fuse arrangements may be blown, eliminating further selection of types of function.

17 Claims, 2 Drawing Sheets

OPTION DECODING WITH ON-CHIP ELECTRICAL FUSES

FIELD OF THE INVENTION

The present invention pertains to the circuit configuration on a semi-conductor chip and more particularly to varying the circuit configuration on a single chip to provide a plurality of circuit types on one chip and the capability to select which circuit is to be provided.

BACKGROUND OF THE INVENTION

In present technology, it may be desirable to change some part of the function of a chip; that is, to perform changes such as converting a latch to a register, or to change the use of a chip pin. This change can also be to modify the complete function of a chip, such as to convert a simple buffer to a complex register. This modification is typically done by changing one or more of the actual interconnect layers so that the underlying transistors are connected differently. Some chips have their functionality changed by decoding a set of control signals which may come from data stored on the chip or from DC signals applied to some of the pins of the chip. One type of chip has these DC signals applied by either bonding out the signal pad to $V_{SS}$ or leaving it unbonded. If left unbonded, an internal pull-up mechanism will cause the signal pad to go to $V_{CC}$.

In all of these techniques, the functionality is advantageously chosen before the chip is placed in the package, after which it cannot be changed. This procedure, which is presently in common use, misses two objectives. First, this procedure does not give the customer or the supplier the ability to change the function of the packaged device at will. Second, in following this procedure, the customer or supplier must maintain a significant finished goods inventory, along with its associated costs, to have the various packaged parts available to meet customer requests.

SUMMARY OF THE INVENTION

The present invention includes a method for varying the type of circuit selected on a chip after completion of packaging and includes the step of providing predetermined fuse arrangements which can be used individually or in combinations corresponding to each type of circuit on the chip. Disable control lines having fuses are provided to each of the predetermined fuse arrangements. When one of the types of circuits is selected, the predetermined fuse arrangement or combination of fuse arrangements corresponding to that selected type of circuit is blown. To prevent further blowing of predetermined fuse arrangements, the fuses in the disable control lines to each of the predetermined fuse arrangements are blown.

The present invention provides a method and apparatus for permitting the functionality of a chip to be chosen at the time when it is to be placed in service or shipped to the customer. The present invention uses fuses made out of the local interconnect layer of the chip although the fuses can be made out of other layers in the process. Connections within the predetermined fuse arrangements are made through fuses which may be blown with only a few milliamps so as to isolate small circuit portions in the arrangement. This in turn may be used to signal a change in functionality in the chip. This change in functionality caused by blowing a particular fuse may be relatively simple, such as converting an inverting output to a non-inverting output. On the other hand, it may be quite complex, such as controlling a portion of a decoding scheme which will radically change the function of the chip.

The present invention accomplishes these objectives in two parts. First, select fuses are blown to choose the functionality of the chip. Second, a fuse or fuses are blown which prevent any further function fuses from being blown, that is, the further modification of the circuits on the chip is disabled.

DESCRIPTION OF THE PREFERRED EMBODIMENTS

The present invention concerns a method and circuit for varying the type of circuit selected on a chip after completion of manufacturing and packaging. This method in its simplest form includes the steps of providing predetermined fuse arrangements which can be used individually or in combinations corresponding to each type of circuit on the chip. Disable control lines, each having a fuse or fuses, are provided to each of the predetermined fuse arrangements. When one of the many types of circuits is selected, the predetermined fuse arrangement or combination of fuse arrangements corresponding to that selected type of circuit is blown. To prevent further blowing of predetermined fuse arrangements, the fuses in the disable control lines to each of the predetermined fuse arrangement corresponding to all unselected types of circuit are blown. Thus, further selection of different types of circuits is disabled.

The present invention provides an apparatus for permitting the functionality of a chip to be chosen at the time when it is to be placed in service or shipped to the customer. Fuses made out of the local interconnect layer (although other process layers may also or optionally be used) of the chip may be used for isolation of portions of the fuse arrangements circuit. Connections to various parts of the fuse arrangement circuit are made through fuses which may be blown using only a few milliamps of current. The change in functionality caused by blowing a particular fuse or combination of fuses may be relatively simple, such as converting an inverting output to a non-inverting output. On the other hand, it may be quite complex, such as controlling a portion of a decoding scheme which will radically change the function of the chip.

The present invention accomplishes these objectives in two parts. First, select fuses are blown to choose the functionality of the circuit on the chip. Second, a fuse or fuses are blown which prevent any further function fuses from being blown; that is, the further modification of the circuits on the chip is disabled.

Figure 1:
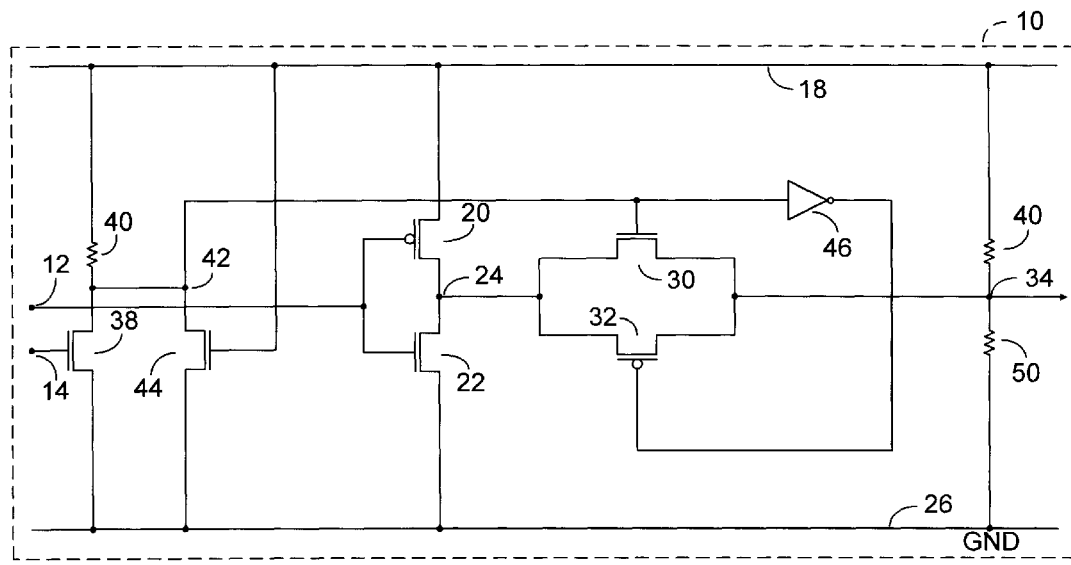
FIG. 1 is a schematic drawing of a circuit of a first embodiment of the present invention.

Referring now to FIG. 1, a schematic diagram of a fused selection circuit is illustrated. Two inputs DATAB and DISABLE are illustrated as connected to pads 12 and 14, respectively, on an integrated circuit chip 16. $V_{CC}$, line 18, is initially at zero volts. DATAB at pad 12 provides the input to transistors 20 and 22, whose drains are connected together at node 24. The source of transistor 20 is line 18, $V_{CC}$, and the source of transistor 22 is ground line 26. Node 24 is connected to the source of transistors 30 and 32, whose drains are connected together at node 34, which may provide an input to a decoder (not shown) of the integrated circuit chip 16. DISABLE signal at pad 14 provides the input to the gate of transistor 38, whose drain is connected to ground 26 and whose source is connected to $V_{CC}$ through fuse 40 at node 42, and directly to the drain of transistor 44. Transistor 44 has its gate connected to line 18, $V_{CC}$, and its source to ground 26. The drain of transistor 44 provides the input to the gates of transistors 30 and 32, with the input to the gate of transistor 32 being made through an inverter 46. Node 34 receives an input from the drains of transistors 30 and 32 and an input from line 18, $V_{CC}$ through fuse 48 and from ground 26 through fuse 50.

DISABLE at pad 14 is set to zero volts and DATAB at pad 12 is set to either zero volts or connected to $V_{CC}$, whichever is the opposite of the final desired signal to the decoder on chip 16. The desired signal to the decoder on chip 16 may have one of two values, zero volts, representing a low, or $V_{CC}$, representing a high. $V_{CC}$, at line 18, is slowly raised to five volts. Since DISABLE at pad 14 is set to zero, transistors 30 and 32 will be on. If DATAB is set to zero as well, then transistor 20 will be on and node 24 and hence the signal to the decoder (not shown) on chip 16 from node 34 will be pulled high to $V_{CC}$. There will be approximately five volts across fuse 50, hence a current will flow through it until it blows. Alternatively, if DATAB is set to "1", or high at pad 12, then transistor 22 will be on and five volts will be across fuse 48 and hence a current will flow through it until it blows.

The signal DISABLE at pad 14 is subsequently raised to "1" or high. This will turn on transistor 38 and a current will flow through fuse 40 until it blows. Once fuse 40 is blown, node 42 is disconnected from $V_{CC}$, line 18, and will be pulled low by the small bleed transistor 44 which is permanently on. If node 42 is low, then transistors 30 and 32 are turned off and this will disconnect node 24 from node 34. The enable/disable fuse 40 can be used to control one or more data fuses, such as fuses 48 and 50.

Figure 2:
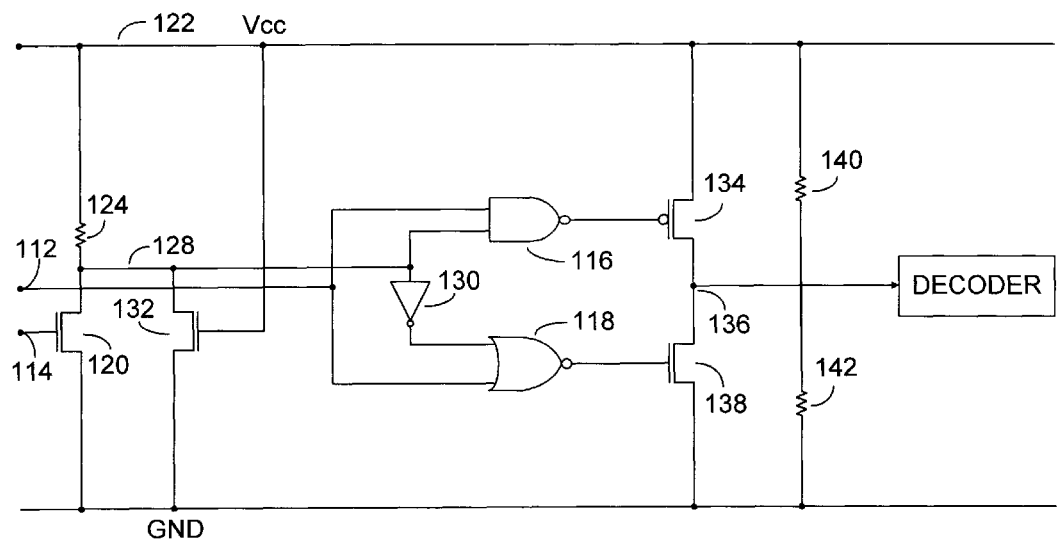
FIG. 2 is a schematic drawing of a circuit of a second embodiment of the present invention.

Referring now to FIG. 2, a schematic diagram of an alternate embodiment of a fused selection circuit is illustrated. DATA signal is present at node 112 and DISABLE signal is present at node 114. DATA signal from node 112 provides one input to NAND gate 116 and one input to NOR gate 118. DISABLE signal at node 114 controls the gate of transistor 120, whose source is connected to line 122, $V_{CC}$, through fuse 124 and whose drain is connected to ground 126. Between transistor 120 and fuse 126 is node 128, from which the second input to NAND gate 116 is taken. NOR gate 118 receives a second input from node 128 through inverter 130. Also connected to node 128 is the drain of transistor 132, whose gate is connected to line 122, $V_{CC}$, and whose source is connected to ground line 126.

The output of NAND gate 116 provides the signal to the gate of transistor 134, the source of which is connected to $V_{CC}$, line 122, and the drain of which is connected to node 136. The output of NOR gate 118 provides the signal to the gate of transistor 138, whose source is connected to ground line 126 and whose drain is connected to node 136. Fuse 140 is connected in parallel with transistor 134, connected on one end to line 122, $V_{CC}$, and at the other end to node 136. Fuse 142 is connected in parallel with transistor 138, having one end connected to ground line 126 and the other end connected to node 136. Node 136 may provide an output to a decoder (not shown) on the chip.

In a preferred operation, $V_{CC}$ is initially set at zero volts. DISABLE signal at node 114 is also set to zero volts. DATA signal at node 112 may be set to zero volts or connected to VCC, depending on the final signal level into the chip from node 136. During this preferred manner of operation, $V_{CC}$ may be slowly raised to five volts.

Since DISABLE signal at node 114 is zero volts, then the value of the signal at node 128 will be pulled high to $V_{CC}$ by the fuse 126 as in the first embodiment, effectively enabling the NAND gate 116 and NOR gate 118.

NAND gate 116 and NOR gate 118 (through inverter 130) may drive the gate of transistor 134 low or the gate of transistor 138 high, depending on the state of the signal DATA at node 112. Hence either transistor 134 will turn on and fuse 142 will be blown or transistor 138 will turn on and fuse 140 will be blown by the current flowing through it as with the first embodiment.

The signal DISABLE at node 114 may be subsequently raised to a "1" or high in the same way as the first embodiment to blow fuse 124 and permanently disable NAND gate 116 and NOR gate 118.

The DATA and DISABLE signals at node 112 and node 114 or node 12 and 14, respectively, may be connected to normal pads/pins on the chip which have another normal function. Once the DISABLE signal has been used to blow fuse 124 or fuse 40, these pins can be used completely independently from the programming technique.

Figure 3:
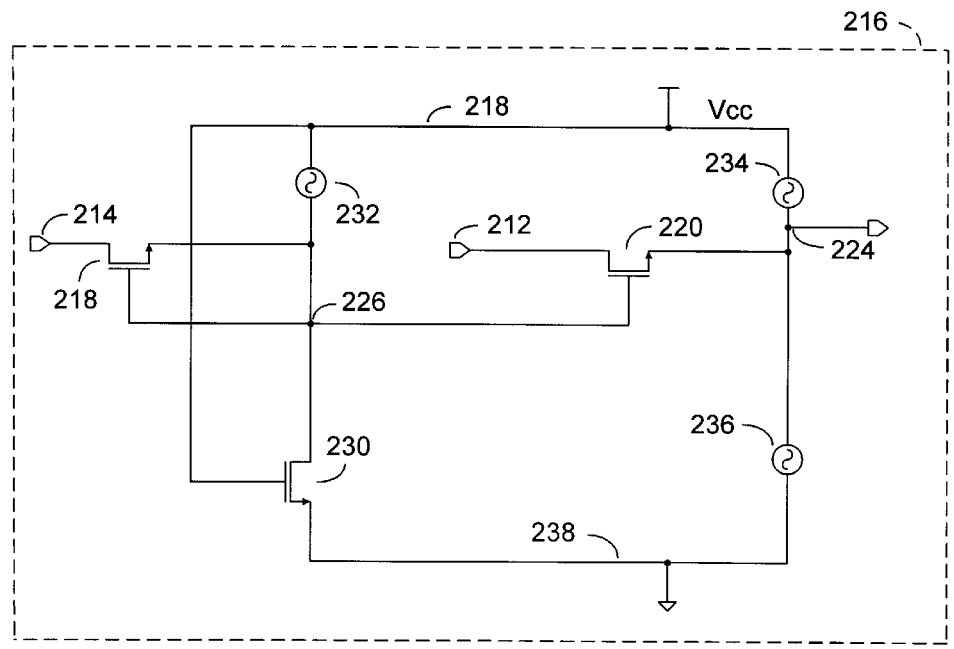
FIG. 3 is a schematic drawing of a circuit of a third embodiment of the present invention.

Referring now to FIG. 3, a schematic diagram of a fused selection circuit is illustrated. Two inputs DATA and DISABLE are illustrated as connected to pads 212 and 214, respectively, on chip 216. $V_{CC}$, line 218, is initially at zero volts. DATA at pad 212 provides the input to the source of transistor 220, whose drain is connected to node 224. The gate of transistor 220 is node 226, which is also connected to the gate of transistor 228. The source of transistor 228 is the DISABLE signal from pad 214. The drain of transistor 228 is also connected to node 226. Node 226 is connected to the drain of transistor 230 and to $V_{CC}$ through fuse 232. Transistor 230 has its gate connected to $V_{CC}$ and its source connected to line 218, ground or zero volts. Node 224 is connected to $V_{CC}$ through fuse 234 and to line 238, ground, through fuse 236. An output signal may be taken from node 224.

In a preferred operation, $V_{CC}$ is initially set at zero volts, and the DISABLE signal at pad 214 is connected to $V_{CC}$. With DISABLE set at $V_{CC}$, fuse 232 connects node 226 to $V_{CC}$, turning on transistors 220 and 228. $V_{CC}$ may be slowly raised to five volts. The DATA signal located at pad 212 may be set at zero volts or $V_{CC}$, depending on whether the output SIGNAL at node 224 is to be a low, "0", or a high, "1". By setting DATA, either fuse 234 or fuse 236 will blow, making SIGNAL at node 224 equal either to $V_{CC}$ or the value at line 238, ground. When DISABLE is lowered to zero volts, fuse 232 is blown where upon transistor 230 will ensure that node 226 is at zero volts, ensuring that transistor 220 is always off. This procedure also permanently disables transistor 228. Effectively, both signals DATA and DISABLE are no longer connected to the fuse arrangement.

Figure 4:
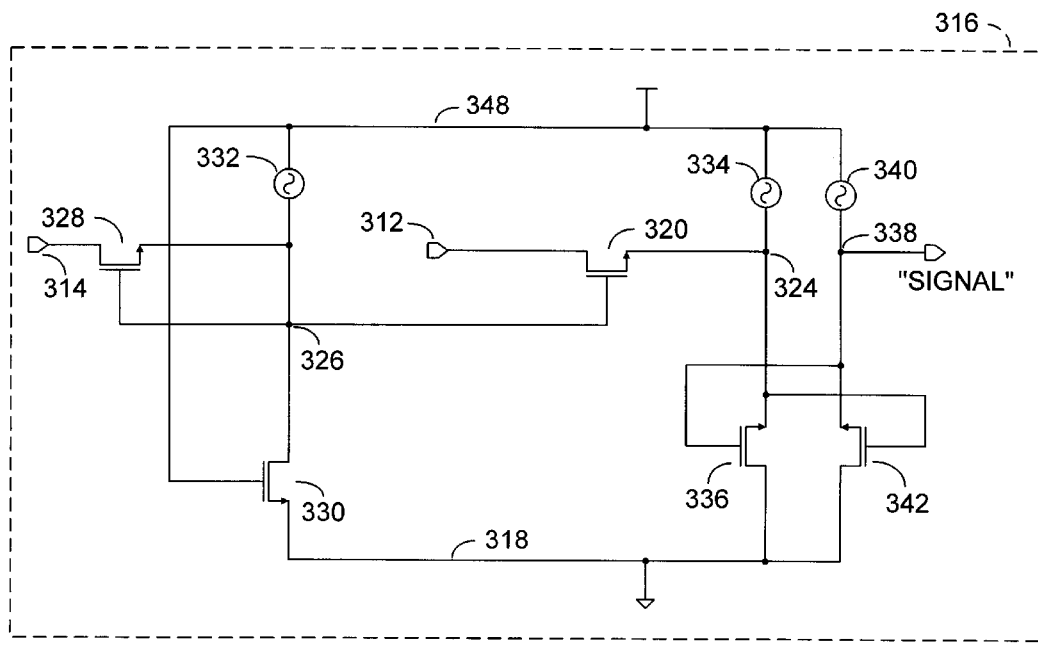
FIG. 4 is a schematic drawing of a circuit of a fourth embodiment of the present invention.

Referring now to FIG. 4, a schematic diagram of a fused selection circuit is illustrated. Two inputs DATAB and DISABLE are illustrated as connected to pads 312 and 314, respectively, on chip 316. $V_{CC}$, line 348, is initially at zero volts. DATAB at pad 312 provides the input to the source of transistor 320, whose drain is connected to node 324. The gate of transistor 320 is node 326, which is also connected to the gate of transistor 328. The source of transistor 328 is the DISABLE signal from pad 314. The drain of transistor 328 is also connected to node 326. Node 326 is connected to the drain of transistor 330 and to $V_{CC}$ through fuse 332. Transistor 330 has its gate connected to $V_{CC}$ and its source connected to line 318, ground or zero volts. Node 324 is connected to $V_{CC}$ through fuse 334 and to the drain of transistor 336, which has its source connected to line 318 ground. The gate of transistor 336 is connected to node 338, from which an output signal may be taken. Node 338 is connected to $V_{CC}$ through fuse 340 and to the drain of transistor 342, which has its source connected to line 318. The gate of transistor 342 is connected to node 324.

In operation, similar to the circuit of FIG. 3, $V_{CC}$ is initially set at zero volts, and the DISABLE signal at pad 314 is connected to $V_{CC}$. With DISABLE set at $V_{CC}$, fuse 332 connects node 326 to $V_{CC}$, turning on transistors 320 and 328. $V_{CC}$ may slowly be raised to five volts. The DATAB signal located at pad 312 may be set at zero volts or $V_{CC}$, depending on whether the signal at node 324 is to be a low, "0", or a high, "1".

If DATAB is at zero volts, then SIGNAL is at zero volts also. Since transistors 336 and 342 are cross coupled, SIGNAL at node 338 will go high or "1" because transistor 342 is off and transistor 336 is on. Under these conditions, $V_{CC}$ will be across fuse 334 and it will blow.

If DATAB is at $V_{CC}$, then transistor 336 will be off and transistor 342 will be on. Under these conditions, $V_{CC}$ will be across fuse 340 and it will blow. SIGNAL at node 338 will go low or zero volts and be connected to line 318, ground. One side or the other of the cross coupled arrangement of transistors 336 and 342 will always be connected to $V_{CC}$ via a fuse while the other side is not because the connecting fuse has been blown.

When DISABLE is lowered to zero volts, fuse 332 is blown when transistor 330 will ensure that node 326 is at zero volts, ensuring that transistor 320 is always off. This procedure also permanently disables transistor 328. Effectively, both signals DATAB and DISABLE are no longer connected to the fuse arrangement.

As described, the present invention allows the function of a chip to be chosen from a preselected list which reduces the required finished goods inventory. It has two stages. First, select fuses are blown to choose the functionality of the circuit on the chip. Second, a fuse or fuses are blown which prevent any additional function fuses from being blown, that is, the further modification of the circuits on the chip is disabled. This technique can be used on packaged integrated circuits. The method and apparatus of the present invention uses electrical fuses which require relatively low currents to blow them. The method and apparatus of the present invention uses these electrical fuses to change the function of the circuit either individually or by decoding some combination of the fuses.

Further, the method and apparatus of the present invention use one or more fuses (or means for disabling an electrical connection) to ensure that the chosen functionality is non-volatile; i.e., no subsequent combination of signal and voltages can be applied to the chip which will cause the functionality to change (for example, by blowing any further fuses).

The method and apparatus of the present invention may avoid special pins or pads on the package or the chip which may be present otherwise. All of the pins may have some function associated with the normal operation of the chip.

One or more electrical fuse circuits as described above can be used to change the functionality of a device between, for example, sixteen different functions which may be completely diverse, such as buffer, register and latches. In some instances, an integrated circuit could use as few as four electrical fuses to decode sixteen options.

Because the sixteen different functions are themselves industry standards, when the chip changes function, there may also be a requirement to change several items such as, for example, the number of I/Os or data paths, the partitioning within the device of groups of data paths, whether the data path is unidirectional or bi-directional, whether the data path is inverting or non-inverting, the function and number of control pins (e.g., output enables, clocks, etc.) whether some data paths are used or unused and whether particular input pins have bus hold or not.

The ability to change functions may be implemented by decoding circuits on the chip. In some integrated circuits, decoding can be done in two levels of logic, or in certain cases, as little as one. For example, the first level may decode the signals from four predetermined fuse arrangements into effectively sixteen different signal wires where one signal wire is active for one of sixteen possible functional options. The second (optional) level may decode the sixteen signal wires into a complete set of control wires which are routed around the chip and control the various internal functions as described above. Thus, the present invention can use one or more electrical fuses to decode a set of control wires, which may completely change the function on the chip.

While there has been illustrated and described particular embodiments of the present invention, it will be appreciated that numerous changes and modifications will occur to those skilled in the art, and it is intended in the appended claims to cover all those changes and modifications which fall within the true spirit and scope of the present invention.

I claim:

1. A method for selecting one or more functionalities of a chip, comprising the steps of:
   choosing at least one functionality by blowing one or more function fuses in a fuse arrangement circuit; and
   disabling further modification of the fuse arrangement circuit by blowing disabling fuses which prevent said one or more function fuses from being blown.

2. The method according to claim 1 wherein said one or more function fuses in said fuse arrangement corresponds to said selected function(s).

3. The method according to claim 2 wherein said step of blowing said one or more function fuses comprises controlling information signals to a decoder to select said selected function(s).

4. The method according to claim 1 wherein said blowing said disabling fuses comprises controlling information signals to a decoder to disable selection of additional function (s).

5. The method according to claim 1 further comprising the step of:
   providing predetermined fuse arrangements corresponding to each type of circuit on the chip for implementing said each different function.

6. The method according to claim 5 further comprising the step of:
   providing disable control lines having fuses to each of said predetermined fuse arrangements.

7. The method according to claim 1 wherein said step of choosing at least one functionality comprises initiating a signal to a decoder to select a function.

8. The circuit according to claim 1, wherein blowing comprises passing electrical current through said fuse(s).

9. An apparatus for selecting one or more functions on a chip having a plurality of different functions comprising:

a plurality of means for enabling each function on the chip, wherein a single means for enabling enables a single function and each of said means for enabling comprises a plurality of fuses;

a plurality of means for disabling each of said means for enabling, each of said means for disabling being connected to a single means for enabling, first circuit means for blowing said means for enabling; and second circuit means for blowing said means for disabling.

10. The apparatus according to claim 9 wherein said first circuit means comprises a pair of transistors having complementary inputs, each transistor controlling one fuse.

11. The apparatus according to claim 9 wherein said first circuit means comprises a NAND gate and a NOR gate, each having a first input receiving a first signal and a second input receiving a complementary second signal, the output of said NAND gate and said NOR gate controlling gates of transistors, each transistor controlling one fuse.

12. The apparatus according to claim 9 wherein each means for disabling comprises a fuse corresponding to a selection circuit for a function.

13. The apparatus according to claim 9 wherein said means for enabling comprises means for providing a signal to a decoder to select a function.

14. An integrated circuit comprising the apparatus of claim 9.

15. The circuit according to claim 9, wherein blowing comprises passing electrical current through said fuse(s).

16. An apparatus for selecting one or more functions on a chip having a plurality of different functions comprising:

a first circuit configured to enable a function on the chip wherein said first circuit comprises a plurality of fuses;

a second circuit configured to disable said first circuit, said second circuit comprising a fuse, a third circuit configured to control the configuration of said first circuit; and a fourth circuit configured to blow said fuse of said second circuit.

17. The circuit according to claim 16, wherein blowing comprises passing electrical current through said fuse(s).

\* \* \* \* \*